United States Patent
Seth et al.

(10) Patent No.: US 9,923,529 B2
(45) Date of Patent: Mar. 20, 2018

(54) CUSTOMIZABLE RAMP-UP AND RAMP-DOWN AMPLITUDE PROFILES FOR A DIGITAL POWER AMPLIFIER (DPA) BASED TRANSMITTER

(71) Applicant: Samsung Electronics Co., Ltd., Gyeonggi-do (KR)

(72) Inventors: Siddharth Seth, Campbell, CA (US); Venumadhav Bhagavatula, Santa Clara, CA (US); Ivan Lu, San Jose, CA (US); Sang Won Son, Palo Alto, CA (US)

(73) Assignee: Samsung Electronics Co., Ltd (KR)

( * ) Notice: Subject to any disclaimer, the term of this patent is extended or adjusted under 35 U.S.C. 154(b) by 131 days.

(21) Appl. No.: 15/137,349

(22) Filed: Apr. 25, 2016

(65) Prior Publication Data

US 2017/0222607 A1    Aug. 3, 2017

Related U.S. Application Data

(60) Provisional application No. 62/290,833, filed on Feb. 3, 2016.

(51) Int. Cl.
*H04W 72/04* (2009.01)
*H03F 3/24* (2006.01)
(Continued)

(52) U.S. Cl.
CPC .............. *H03F 3/245* (2013.01); *H03F 3/19* (2013.01); *H04B 1/0475* (2013.01); *H04L 5/22* (2013.01);
(Continued)

(58) Field of Classification Search
CPC . H03F 3/245; H03F 1/301; H03F 3/19; H03F 5/22; H04B 1/0475; H04W 72/1263; H04W 84/042
See application file for complete search history.

(56) References Cited

U.S. PATENT DOCUMENTS 6,101,224 A    8/2000   Lindoff et al.
6,307,429 B1  10/2001   Olgaard
(Continued)

OTHER PUBLICATIONS

Becker, Rolf et al., PRAM—A Power Ramping Controller for TDMA Systems in Digital Mobile Telecom Applications, 1997 IEEE International Solid-State Circuits Conference, Copyright IEEE, pp. 2.
(Continued)

*Primary Examiner* — Andrew Lee
(74) *Attorney, Agent, or Firm* — The Farrell Law Firm, P.C.

(57) ABSTRACT

Apparatuses, systems, and methods for a digital power amplifier (DPA) to generate a monotonic and linear ramp-up and ramp-down for a time division multiple access (TDMA) slot transmission are described. In one aspect, a monotonic and linear amplitude-to-control input code relationship model is generated for the DPA and stored. When the DPA needs to generate a ramp-up or ramp-down, the stored monotonic and linear amplitude-to-control input code relationship model is used to shape the input control code before it is input into the DPA. A new monotonic and linear amplitude-to-control input code relationship model may be generated and stored if the operating conditions change. The apparatuses, systems, and methods described herein may be applied to a multi-standard broadband modem chip capable of 2G transmission.

20 Claims, 9 Drawing Sheets

(51) Int. Cl.
H03F 3/19 (2006.01)
H04L 5/22 (2006.01)
H04B 1/04 (2006.01)
H04W 72/12 (2009.01)

(52) U.S. Cl.
CPC ... *H04W 72/1263* (2013.01); *H03F 2200/451* (2013.01); *H04B 2001/0408* (2013.01)

(56) References Cited

U.S. PATENT DOCUMENTS

| | | | |
|---|---|---|---|
| 6,625,227 | B1 | 9/2003 | Shull et al. |
| 6,701,138 | B2 | 3/2004 | Epperson et al. |
| 6,868,279 | B2 | 3/2005 | Sahlman et al. |
| 7,068,985 | B2 | 6/2006 | Quilisch et al. |
| 7,725,086 | B2 | 5/2010 | Maerzinger et al. |
| 7,877,060 | B1 | 1/2011 | Khlat et al. |
| 7,962,108 | B1 | 6/2011 | Khlat et al. |
| 8,009,765 | B2 | 8/2011 | Ahmed et al. |
| 8,031,028 | B2 | 10/2011 | Wojtiuk |
| 8,224,265 | B1 | 7/2012 | Mahoney |
| 8,295,396 | B2 | 10/2012 | Waheed et al. |
| 8,462,035 | B2 | 6/2013 | Schimper et al. |
| 8,489,042 | B1 | 7/2013 | Hietala |
| 8,599,938 | B2 | 12/2013 | Aniruddhan et al. |
| 2007/0091973 | A1* | 4/2007 | Henschke ............ H01S 3/10092 372/92 |
| 2007/0190952 | A1* | 8/2007 | Waheed ................ H04B 1/0475 455/114.3 |
| 2008/0205571 | A1* | 8/2008 | Muhammad .......... H04L 27/361 375/376 |
| 2009/0052575 | A1* | 2/2009 | Waheed ................ H04L 27/368 375/297 |
| 2009/0054018 | A1* | 2/2009 | Waheed ................ H03G 3/3047 455/126 |
| 2010/0188148 | A1* | 7/2010 | Mehta ...................... H03F 1/30 330/149 |
| 2016/0065143 | A1* | 3/2016 | Grand ...................... H03F 1/26 330/252 |
| 2016/0072444 | A1* | 3/2016 | Gorbachov ............ H03F 1/301 330/256 |
| 2016/0191086 | A1* | 6/2016 | Ripley ...................... H03F 1/56 375/296 |

OTHER PUBLICATIONS

Becker, Rolf et al., RF Power Control in GSM Systems for Constant and Non Constant Envelope Modulation Schemes, Copyright 2003 IEEE, pp. 4.

Georgantas, Theodore et al., A 13mm2 40nm Multiband GSM/EDGE/HSPA+/TDSCDMA/LTE Transceiver, 2015 IEEE International Solid-State Circuits Conference, Copyright 2015 IEEE, pp. 3.

Hietala, Alex W., A Quad-Band 8PSK/GMSK Polar Transceiver, Copyright 2006 IEEE, pp. 1133-1141.

Krit, Salanddine et al., Class D Audio Amplifier with Trim-able Ramp Generator Degisn Theory and Design implementation for portable applications M.J.Condensed.Mater vol. 11, No. 1, Jul. 2009, Copyright 2009 The Moroccan Physical and Condensed Matter Society, pp. 96-100.

Pullela, Raja et al., An Integrated Closed-Loop Polar Transmitter with Saturation Prevention and Low-IF Receiver for Quad-Band GPRS/EDGE 2009 IEEE International Solid-State Circuits Conference, Copyright 2009 IEEE, pp. 112-114.

Seth, Siddharth et al., A Dynamically-Biased 3G/3G/4G Multi-Band Transmitter with >4dBm Pout, <-65dBc CIM3 and <-157dBc/Hz Out-of-Band Noise in 28 nm CMOS 2015 IEEE Radio Frequency Integrated Circuits Symposium, Copyright 2015 IEEE, pp. 147-150.

Seth, Siddharth et al., A Dynamically Biased Multiband 2G/3G/4G Cellular Transmitter in 28 nm CMOS, IEEE Journal of Solid-State Circuits, Copyright 2015 IEEE, pp. 13.

Strange, Jon et al., A HSPA+/WCDMA/EDGE 40nm Modem SoC with embedded RF transceiver supporting RX diversity 2014 IEEE Radio Frequency Integrated Circuts Symposium, Copyright 2014 IEEE, pp. 133-136.

Ye, Lu et al., A Digitally Modulated 2.4GHz WLAN Transmitter with Integrated Phase Path and Dynamic Load Modulation in 65nm CMOS 2013 IEEE Internation Solid-State Circuits Conference, Copyright 2013 IEEE, pp. 330-332.

Yoo, Sang-Min et al., A Switched-Capacitor RF Power Amplifier, IEEE Journal of Solid-State Circuits, vol. 46, No. 12, Dec. 2011, Copyright 2011 IEEE, pp. 2977-2987.

Zheng, Shiyuan et al., A CMOS WCDMA/WLAN Digital Polar Transmitter with AM Replica Feedback Linearization IEEE Journal of Solid-State Circuits, vol. 48, No. 7, Jul. 2013, Copyright 2013 IEEE, pp. 1701-1709.

* cited by examiner

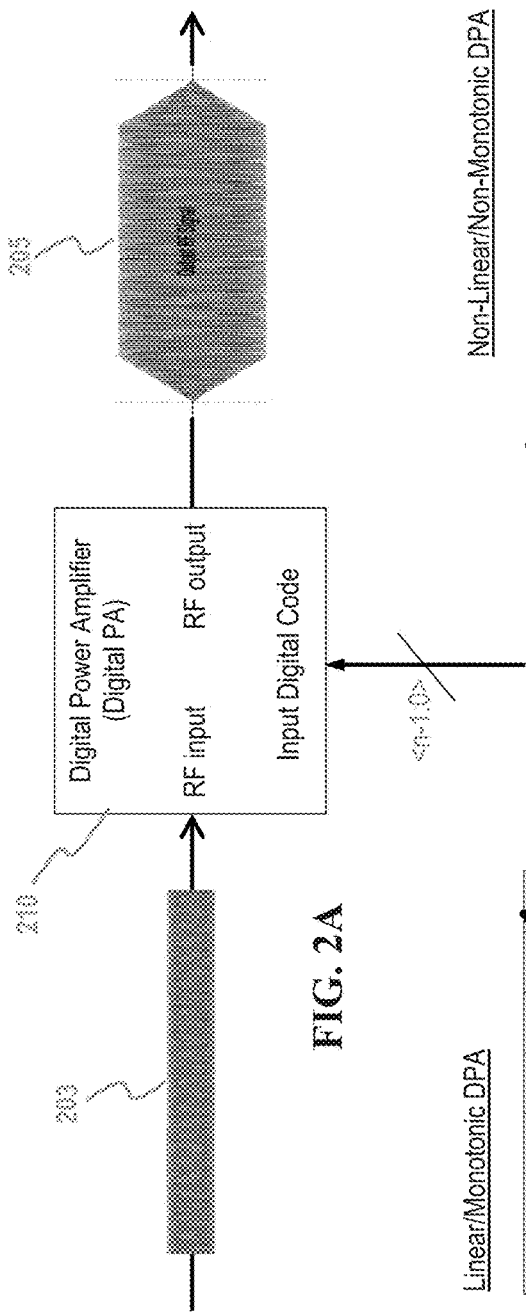
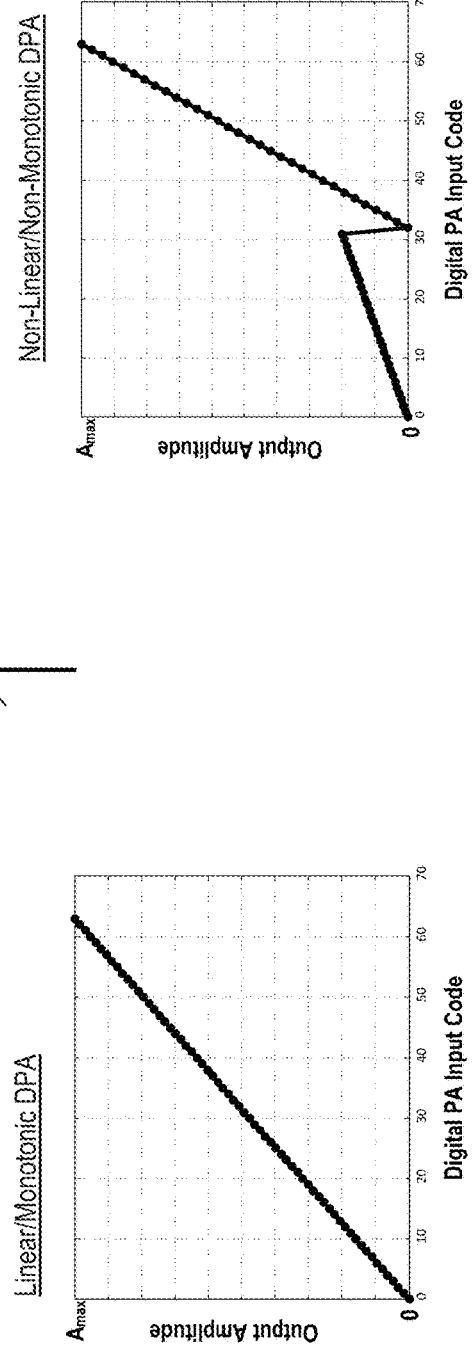
FIG. 2A
FIG. 2B
FIG. 2C

Real-time operation
(Digital PA control)

One-time operation
(Model Buildup)

CUSTOMIZABLE RAMP-UP AND RAMP-DOWN AMPLITUDE PROFILES FOR A DIGITAL POWER AMPLIFIER (DPA) BASED TRANSMITTER

PRIORITY

This application claims priority under 35 U.S.C. § 119(e) to a U.S. Provisional Patent Application filed on Feb. 3, 2016 in the United States Patent and Trademark Office and assigned Ser. No. 62/290,833, the entire contents of which are incorporated herein by reference.

FIELD

The present disclosure relates generally to digital power amplifier (DPA) based transmitters, and more particularly, to providing adaptive/customizable ramp-up and ramp-down amplitude profiles for a DPA-based transmitter.

BACKGROUND

While the technology for cellular communication is constantly evolving, with network providers pushing the 3G/4G technologies into the market, legacy 2G technologies still account for a major portion of total mobile broadband connections, and subsequently cellular handsets have to support 2G, 3G, and 4G modes of communications. Developing such a multi-standard mobile terminal demands a broadband modem chip with the highest possible levels of integration within a minimum silicon area, which can be difficult and costly.

One reason for the difficulty is that the electrical and system requirements specifications of the 2G, 3G, and 4G standards are significantly different. The 2G standard uses a time division multiple access (TDMA) system in which the mobile terminal's transceiver operates in burst mode (i.e., quickly turning on and then off) so it can transmit in its allocated time slot in a subframe of eight slots. See, e.g., European Telecommunications Standards Institute (ETSI) Global System for Mobile Communications (GSM) 05.05 ver. 8.5.1 Release 1999: "Digital cellular telecommunications system (Phase 2+); Radio transmission and reception" (EN 300 910 V8.5.1 (2000-11)) (hereinafter "ETSI GSM Release 1999" will refer collectively to the documents forming ETSI GSM Release 1999); online at http://www.etsi.org/deliver/etsi_en/300900_300999/300910/ 08.05.01_60/en_300910v080501p.pdf, which is hereby incorporated by reference in its entirety. Other standards, such as 3G and 4G, use, for example, frequency division multiple access (FDMA), orthogonal FDMA (OFDMA), and spatial diversity (such as, e.g., multiple input multiple output (MIMO)), as well as TDMA.

In legacy 2G handsets, a dedicated 2G-PA front-end module with power-ramp control was used to guarantee these conditions and more. However, such a dedicated 2G-PA is too expensive to implement in a multiple standard mobile terminal, e.g., a mobile terminal that has the capability to transmit and receive 2G, 3G, and 4G standard signals.

SUMMARY

Accordingly, the present disclosure has been made to address at least the problems and/or disadvantages described above and to provide at least the advantages described below.

According to an aspect of the present disclosure, a method is provided, including: detecting one or more control input codes to a digital power amplifier (DPA) that generate a non-monotonic amplitude output; generating a monotonic amplitude-to-control input code relationship model for the DPA based on the one or more control input codes; adjusting the monotonic amplitude-to-control input code relationship model to construct a monotonic and linear amplitude-to-control input code relationship model; and storing the monotonic and linear amplitude-to-control input code relationship model, wherein, during ramp generation by the DPA, the stored monotonic and linear amplitude-to-control input code relationship model is applied to a control code for one of a ramp-up and a ramp-down before the control input code is input to the DPA.

According to another aspect of the present disclosure, a method is provided, including: if a time division multiple access (TDMA) slot is to be generated by a digital power amplifier (DPA), retrieving control input code for a ramp-up shape from a ramp shape storage, where the control input code is for controlling an amplitude of the DPA; adjusting the retrieved control input code for frequency and amplitude; shaping the frequency-adjusted and amplitude-adjusted control input code based on a monotonic and linear amplitude-to-control input code relationship model; and inputting the shaped control input code to the DPA to generate the ramp-up shape, wherein the monotonic and linear amplitude-to-control input code relationship model is based on an amplitude-to-control input code relationship of the DPA.

According to yet another aspect of the present disclosure, a broadband modem chip is provided, including: a digital power amplifier (DPA); at least one non-transitory computer-readable medium; and a processor, wherein, if a time division multiple access (TDMA) slot is to be generated, the processor executes instructions stored on the at least one non-transitory computer-readable medium, which, when executed, has the broadband modem chip perform at least the following steps: retrieving control input code for a ramp-up shape from a ramp shape storage, where the control input code is for controlling an amplitude of the DPA; adjusting the retrieved control input code for frequency and amplitude; shaping the frequency-adjusted and amplitude-adjusted control input code based on a monotonic and linear amplitude-to-control input code relationship model; and inputting the shaped control input code to the DPA to generate the ramp-up shape, wherein the monotonic and linear amplitude-to-control input code relationship model is based on an amplitude-to-control input code relationship of the DPA, and was previously generated and stored.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 2A is a block diagram of a Digital Power Amplifier (DPA) to which embodiments of the present disclosure can be applied;

FIG. 2B is a graph of output amplitude vs. DPA control code that is monotonic and linear;

FIG. 2C is a graph of output amplitude vs. DPA control code that is non-monotonic and non-linear;

FIG. 8A is a graphic illustrating an example of mapping input codes to monotonic input codes according to an embodiment of the present disclosure, while

FIG. 9A is a graphic illustrating an example of mapping input codes to monotonic and linear input codes according to an embodiment of the present disclosure, while FIG. 10A is a graphic of time step vs. input code when the ramp shapes of FIG. 5C are mapped to the input code by applying the relationship illustrated by FIG. 9A according to an embodiment of the present disclosure, while

DETAILED DESCRIPTION

Figure 1:
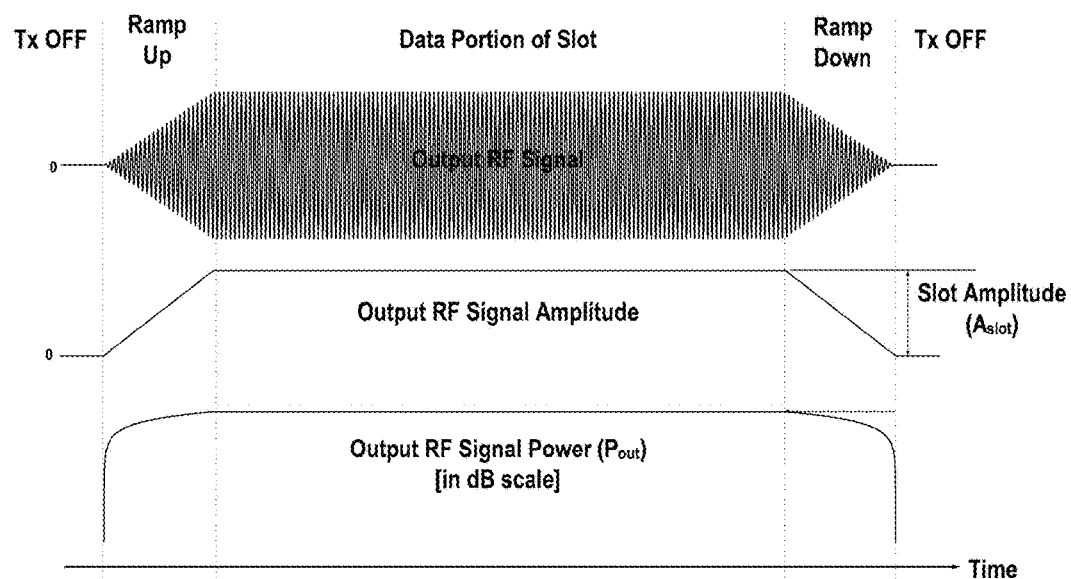
FIG. 1 is a diagram showing different aspects of a 2G slot transmission.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

As discussed above, a dedicated 2G-PA front-end module for power-ramp control is the conventional solution to maintaining 2G transmission standards. However, a dedicated 2G-PA uses up many resources, such as silicon area, making it less practical and/or desirable in a broadband modem chip capable of multi-standard communication including 2G.

FIG. 1 is a diagram showing different aspects of a 2G slot transmission: the top is a simplified drawing of the waveform of the transmission (labelled "Output RF Signal"); the middle (labelled "Output RF Signal Amplitude") shows the desired characteristics of the transmission, including $A_{slot}$ the transmission slot amplitude; and the bottom (labelled "Output RF Signal Power ($P_{out}$) [in dB scale]") shows the output RF signal power $P_{out}$ in a logarithmic scale. When transmitting, the transceiver's $P_{out}$ needs to be properly shaped for ramp-up and ramp-down in order to ensure that the output signal meets the frequency-mask specifications as well the time-mask specifications related to the output-power versus time profile. See, e.g., ETSI GSM Release 1999, GSM 05.05 ver. 8.5.1 Release 1999, Annexes A and B. Nominally, the transceiver needs to be able to cover a 30 dB power-control range for the maximum transmitted power $P_{max}$ in the data portion of the slot, although in practice, the range should be larger. Moreover, the $P_{out}$ and $A_{slot}$ can change, for a single mobile terminal, from one transmission slot to its next allocated transmission slot.

Different solutions for multi-standard broadband modem chip design have recently been suggested. See, e.g., Georgantas et. al. "A 13 mm 40 nm Multiband GSM/EDGE/HSPA+/TDSCDMA/LTE transceiver", ISSCC Dig. Tech. Papers, pp. 160-161, February 2015; and Strange et al., "A HSPA+/WCDMA/EDGE 40 nm Modem SoC with embedded RF transceiver supporting RX diversity", 2014 IEEE Radio Frequency Integrated Circuits (RFIC) Symposium, pages 133-136, June 2014, which are both incorporated herein by reference in their entirety.

The present application is also related to a digital power amplifier (DPA) based GMSK transmitter for the 2G mode which is embedded into a 3G/4G I/Q modulator with minimum area penalty. See U.S. patent application Ser. No. 15/065,433, entitled "Apparatus for and Method of Programmable Matching Network for Multiple Signal Types" and filed on Mar. 9, 2016 (hereinafter referred to as "the '433 application"), which is incorporated herein by reference in its entirety. In the transceiver, a ramp generation block is implemented completely on chip and provides the digital control signal for the DPA to ensure the 2G ramp characteristics when transmitting a 2G slot. While the present disclosure is not limited in any way to the other application, the other application may be referred to for ease of convenience concerning the general environment some embodiments of the present disclosure could be implemented in. Moreover, the present disclosure is not limited to multi-standard modem chips, although highly useful for such chips, but may be implemented in a 2G-only mobile terminal with a DPA. In any embodiment, the ramp control of the present disclosure could be implemented entirely on chip.

According to one embodiment, the present DPA provides ramp control by shaping the ramp per specified 2G requirements and avoiding non-linearity and non-monotonicity.

FIG. 2A is a block diagram of DPA to which embodiments of the present disclosure are applied. As would be understood by one of ordinary skill in the art, FIG. 2A is a simplified block diagram, showing the pertinent details for the present disclosure, and a real-world implementation would be much more complex, requiring, for example, more stages, components, input/output lines, and/or control lines, and would also vary depending on the requirements of the particular implementation.

In FIG. 2A, DPA 210 has an n bit control input, a fixed-amplitude frequency-phase modulated (or single tone) carrier signal 203 for input, and an amplified and/or otherwise shaped version of the input signal as output signal 205. The amplitude/shaping of output signal 205 is a function of the n bit control input code, i.e., by changing the input control code the amplitude/shape of the output signal 205 can be changed. In the 2G standard, the polar transmitter's output needs to be ramped up at an assigned start, held at the desired amplitude, and then ramped down as shown in FIG. 1 above. The slot amplitude ($A_{slot}$) needs to be set to a value between 0 and $A_{max}$ depending on the system-specified requirement for that particular slot.

However, the relationship between the amplitude/shape of output signal 205 and the digital input control code depends on the exact implementation of the DPA.

When the DPA has a 6-bit control signal (n=6), the control signal values go from 0 to 63 (=$2^6$−1), which corresponds to a minimum amplitude of 0 and a maximum amplitude $A_{max}$ at the maximum code of 63, i.e., 63 is the value of the input binary code which will cause the DPA to generate the maximum amplitude. When the relationship between the amplitude/shape of output signal and the digital input control code is monotonic and linear, the amplitude/code graph of the control code going from 0 to 63 looks like FIG. 2B.

However, in some DPAs, the relationship between the amplitude/shape of the DPA's output signal and its input control code is not monotonic and linear for all input codes in all situations. Using the same 6-bit control signal, an example of such a non-monotonic and non-linear output signal is shown in FIG. 2C. Such nonlinearity and/or non-monotonicity might arise due to the particular way in which the DPA is designed. See, e.g., the '433 application. It may also arise from nonidealities in the DPA introduced during manufacturing or because of changing parameters like temperature during operation.

In systems, apparatuses, and methods according to various embodiments of the present disclosure, a time-varying digital input DPA control code is generated that shapes the DPA's output amplitude $A_{out}$ to avoid non-monotonic and/or non-linear changes, regardless of the DPA's implementation/construction—i.e., even with a DPA that usually generates such non-monotonic and/or non-linear changes when using normal digital input control code. Moreover, in systems, apparatuses, and methods according to various embodiments of the present disclosure, the 2G specifications, such as the $A_{out}$ level, the rate of rise/fall in a particular ramp up/down, etc., are also met, even when using a DPA. Furthermore, ramp generation can be programmable, and the ramp-generation block can be implemented entirely on-chip.

Figure 3:
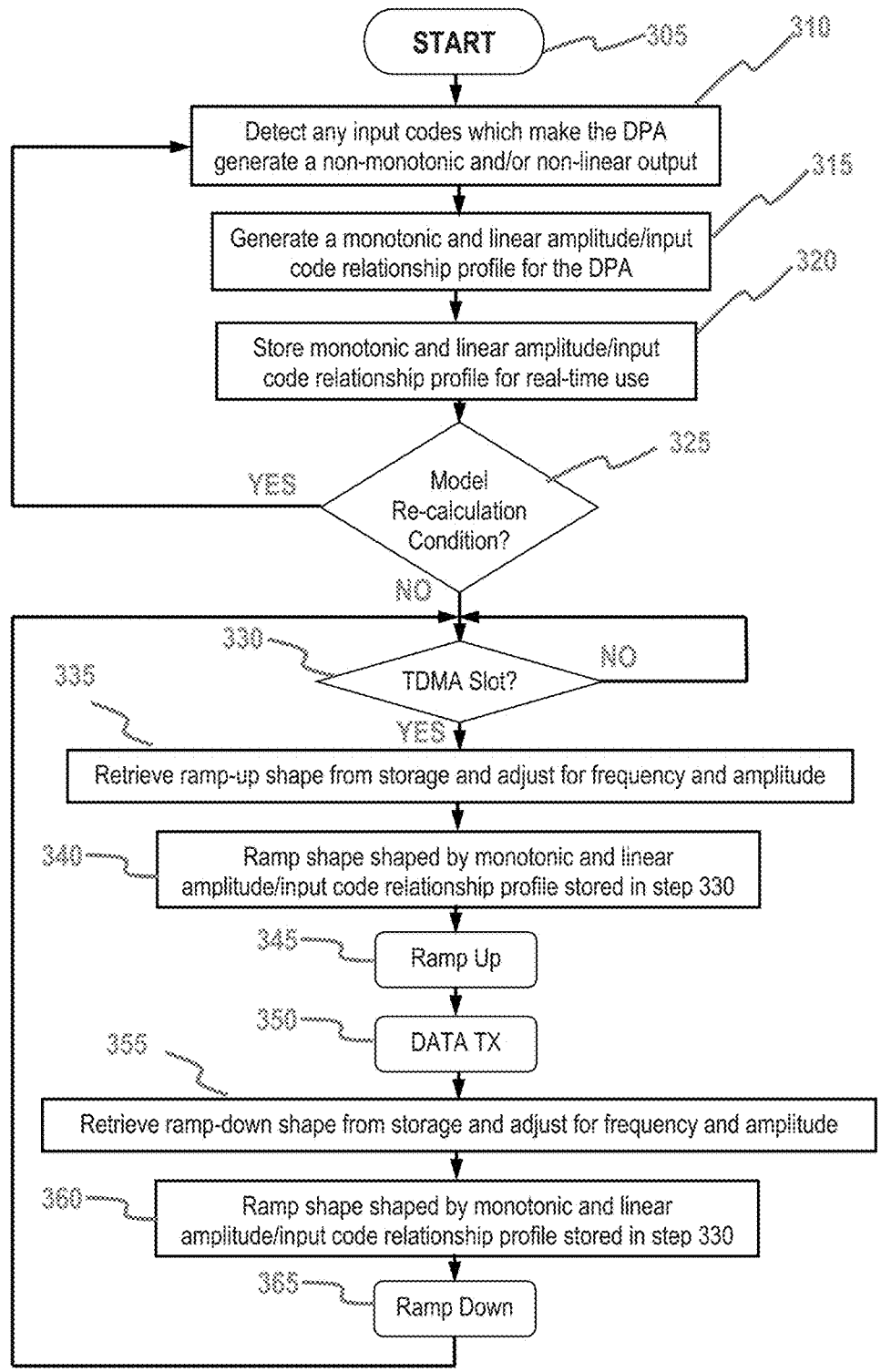
FIG. 3 is a flowchart of the general operations for amplitude-to-control input code relationship model creation and ramp-up/ramp-down generation for a DPA according to an embodiment of the present disclosure.

FIG. 3 is a flowchart of the general operations for amplitude-to-control code relationship model creation and ramp-up/ramp-down generation for a DPA according to an embodiment of the present disclosure. As would be understood by one of ordinary skill in the art, FIG. 3 is a simplified flowchart, its description below is a simplified overview for convenience of explanation, and a real-world implementation would be much more complex, require more stages and/or components, and would also vary depending on the requirements of the particular implementation. More detailed embodiments are described below.

At 305, the present process starts. This may happen, for example, the first time a broadband modem chip having a DPA according to an embodiment of the present disclosure is initiated, whether by the manufacturer or by a consumer after purchase.

At 310, the present system detects any input control codes which make the DPA generate non-monotonic and/or non-linear outputs. At 315, the present system generates a monotonic and linear amplitude-to-control input code relationship profile for the DPA, which may be more or less difficult depending on whether non-monotonic and/or non-linear outputs are detected. At 320, the present system stores the monotonic and linear amplitude-to-control input code relationship profile for real-time usage. The present system provides amplitude-to-control code relationship model creation at 310-330 according to embodiments of the present disclosure.

At 325, the present system determines whether there is a model re-calculation condition. If there is a model re-calculation condition, the process returns to 310-320 to generate a possibly new amplitude-to-control code relationship model. Examples of possible model re-calculation conditions include, but are not limited to, operating parameter changes, such as changes in temperature or power supply voltage to the DPA. Although 325 is shown in FIG. 3 as part of the real-time operation of the DPA, 325 may not be a part of the real-time operation, but rather simply be triggered by the controller based on a change in temperature or power supply voltage.

At 330, the present system determines whether a TDMA slot is to be generated. If so, then at 335, the present system retrieves a ramp shape from storage, in this case, a ramp-up shape, and adjusts the ramp shape for the appropriate frequency and amplitude. At 340, the present system shapes the frequency- and amplitude-adjusted ramp shape using the amplitude-to-control code relationship model created at 310-320 in order to prevent any possible non-monotonicity and/or non-linearity. Next, at 345, the present system ramps up the TX output power by clocking the shaped ramp shape into the DPA.

At the end of the ramp up phase, the present system transmits the data portion at 350 as illustrated in FIG. 1.

Once the data portion transmission is complete, the present system retrieves the appropriate ramp-down shape and adjusts it for frequency and amplitude at 355. At 360, the present system shapes the ramp shape by using the monotonic and linear amplitude-to-control input code relationship profile stored at 330, before it is transmitted as the end of the slot at 365.

When the present system ramps down the TDMA slot at 365, the process returns to 330 after the end of the ramp-down to wait for the generation of another TDMA slot. 330-365 constitute real-time ramp generation according to embodiments of the present disclosure.

In systems, apparatuses, and methods according to various embodiments of the present disclosure, any nonlinear and/or non-monotonic output inherent in a DPA can be corrected. The actual amplitude at the output of the DPA can be made to follow any shape with respect to time, even if normal input control code generates nonlinear/non-monotonic amplitude output levels. Moreover, since a digital approach is being used, practically any nonlinear and/or non-monotonic amplitude output inherent in a DPA can be fixed. Depending on the modulation standard and its respective time mask(s), almost any ramp shape can be programmed.

Below, the real-time operation of the ramp generation block according to an embodiment of the present disclosure is described. As mentioned above, the ramp-generation block can be programmable, implemented on-chip, ensure compliance with the 2G standard specifications, and avoid non-monotonic and/or non-linear changes in DPA output.

Figure 4:
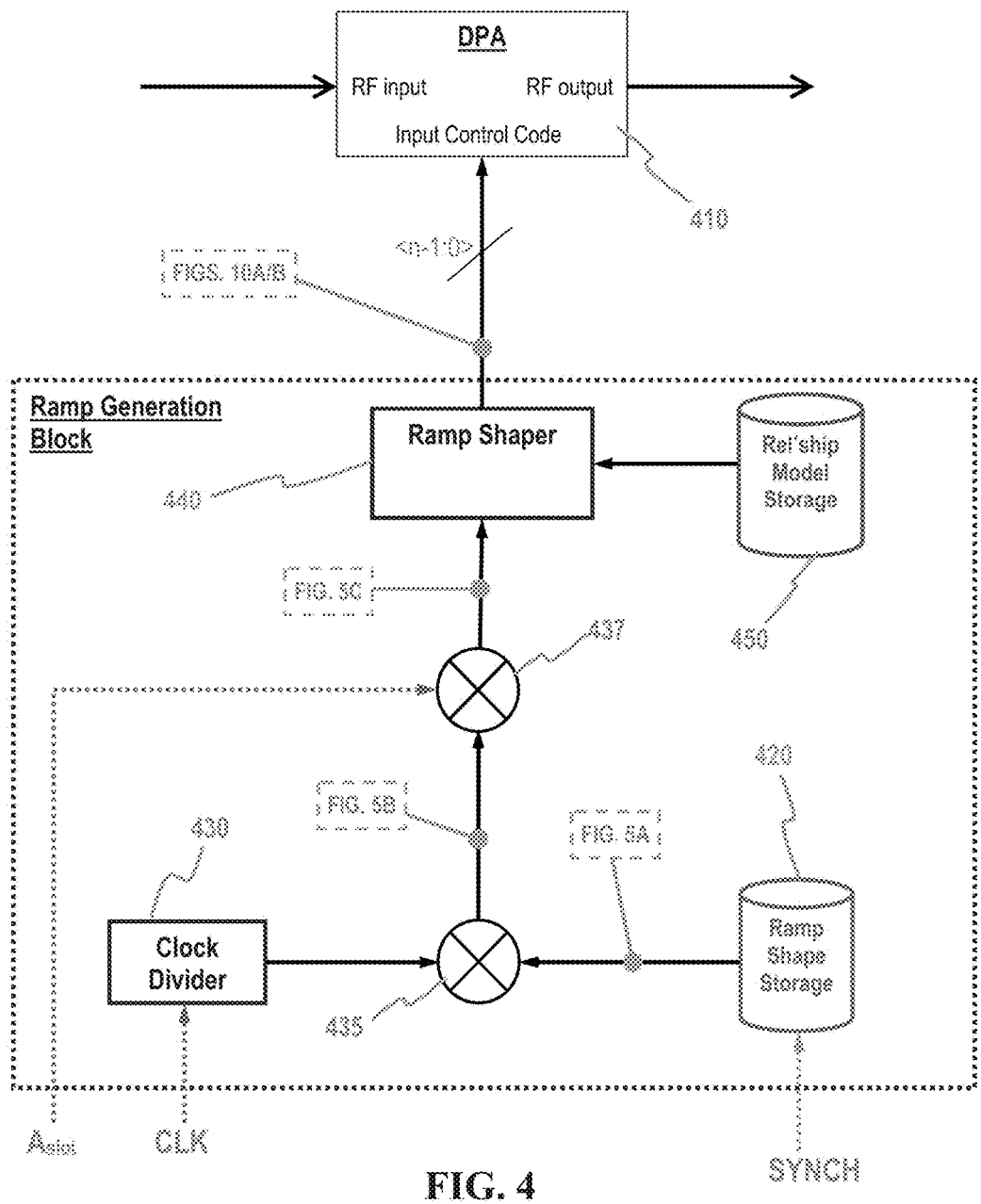
FIG. 4 is a block diagram of a DPA with a ramp generation block according to an embodiment of the present disclosure.
Figure 5A:
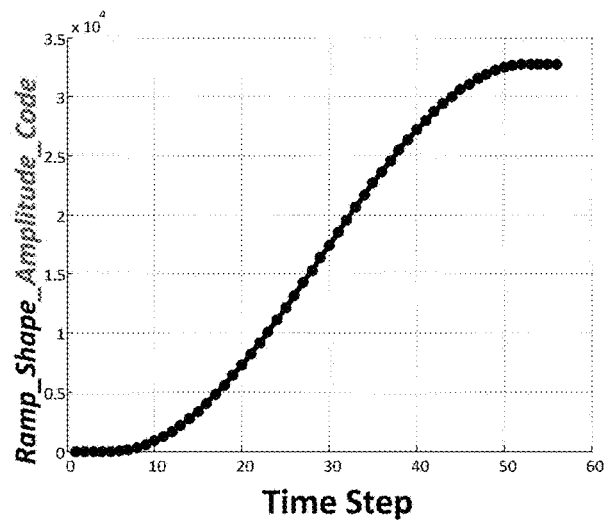
FIGS. 5A-5C are amplitude graphs illustrating examples of how the ramp shape is manipulated in a ramp generation block according in to an embodiment of the present disclosure.
Figure 5B:
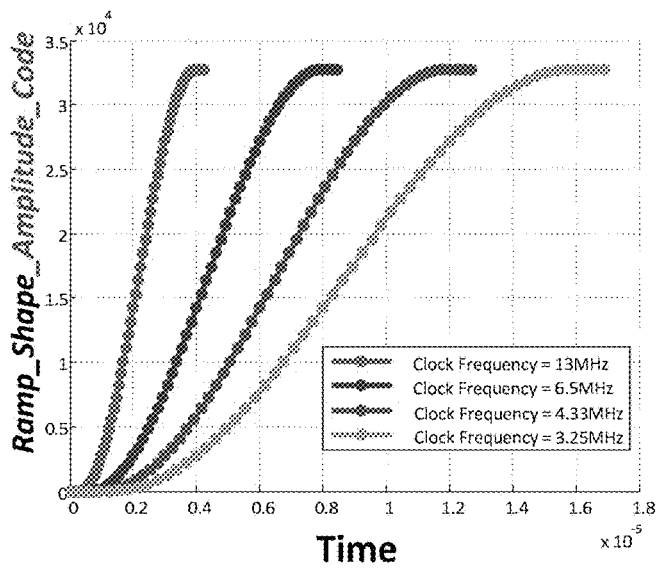
Figure 5C:
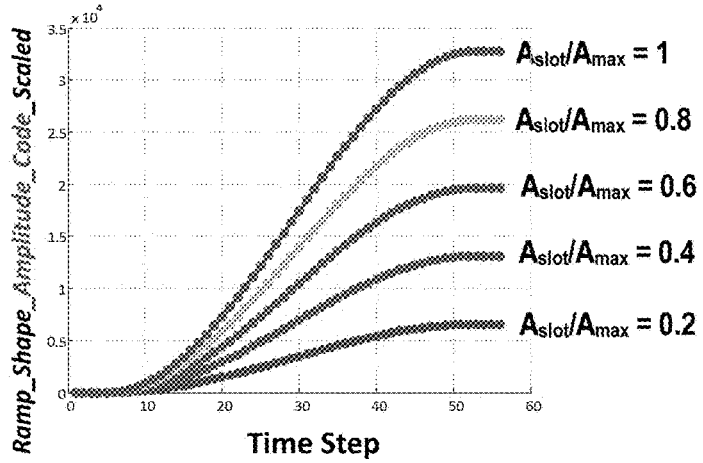
Figure 6:
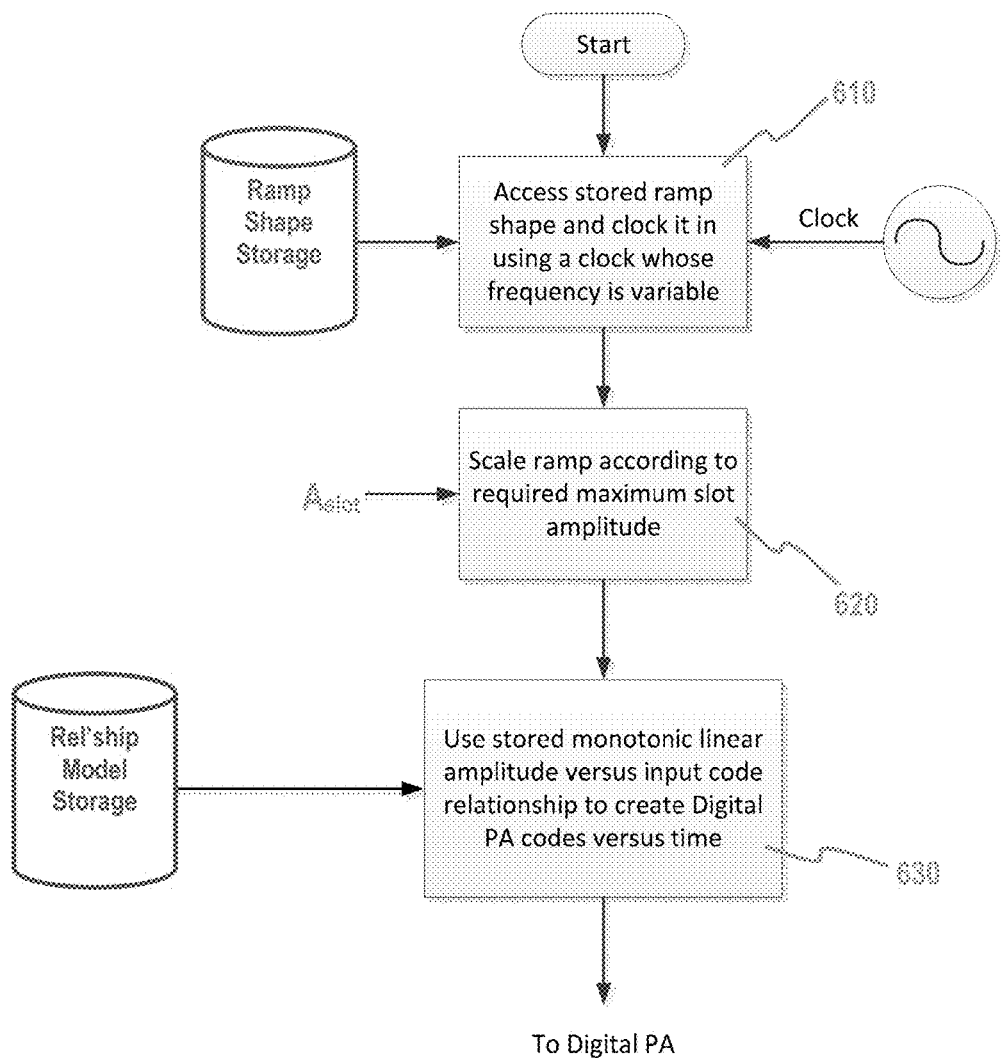
FIG. 6 is a flowchart of the real-time operation of a ramp generation block according to an embodiment of the present disclosure.

FIG. 4 is a block diagram of a DPA with a ramp generation block according to an embodiment of the present disclosure. The implementation of the ramp generation block may take many forms, as would be understood by one of ordinary skill in the art. For example, the ramp generation block may be a digital block programmable using a hardware description language, such as, for example, Verilog or Very High Speed Integrated Circuit (VHSIC) Hardware Description Language (VHDL), and synthesized using digital synthesis tools. FIGS. 5A-5C are amplitude graphs illustrating examples of how the ramp shape is generated and manipulated in the ramp generation block. FIG. 6 is a flowchart of the real-time operation of a ramp generation block according to an embodiment of the present disclosure.

FIG. 4 has an n-bit DPA 410 of which the n-bit control signal is received from the ramp generation block, which includes a ramp shape storage 420, a clock divider 430, a mixer 435, a multiplier 437, a ramp shaper 440, and a relationship model storage 450. Where the examples of amplitude graphs FIGS. 5A-5C would be generated within the ramp generation block are marked in FIG. 4 as well.

When the ramp shape storage 420 receives a ramp start signal trigger (e.g., a SYNCH signal), the ramp shape storage 420 retrieves and outputs a stored customized ramp shape digital code, which may include any arbitrary number of bits M. FIG. 5A is an example of a customized ramp shape digital code Ramp_Shape as a raised cosine, where M=15 and thus the ramp shape goes from 0 to 32,767 (=$2^{15}$–1) over 56 time steps.

The "clock" (or frequency) of the stored customized ramp shape digital code is altered by mixing (435) the output of the clock divider 430 and the stored customized ramp shape digital code. The clock divider 430 receives a reference signal CLK, changes that reference signal CLK to the desired clock for the ramp (by changing its divide ratio), and outputs the desired clock to the mixer 435. FIG. 5B provides four examples of the ramp shape in FIG. 5A having its clock (frequency) changed. Specifically, from left to right, the first ramp is clocked at 13 MHz, the second at 6.5 MHz, the third at 4.33 MHz, and the fourth at 3.25 MHz.

The frequency-altered ramp shape, such as shown in FIG. 5B, is multiplied (437) with the slot amplitude $A_{slot}$ to be appropriately scaled to the appropriate slot level. FIG. 5C provides five examples of the amplitude of the ramp shape in FIG. 5A being scaled. On the right hand of each shape, the $A_{slot}/A_{max}$ ratio is indicated. Specifically, from top to bottom, the first ramp is scaled at $A_{slot}/A_{max}$=1, the second at $A_{slot}/A_{max}$=0.8, the third at $A_{slot}/A_{max}$=0.6, the fourth at $A_{slot}/A_{max}$=0.4; and the fifth at $A_{slot}/A_{max}$=0.2.

Figure 9A:
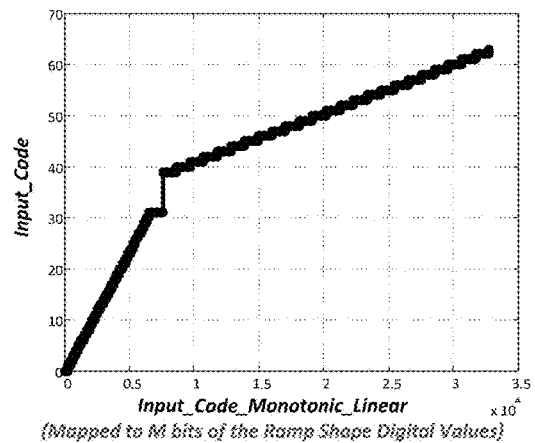
Figure 9B:
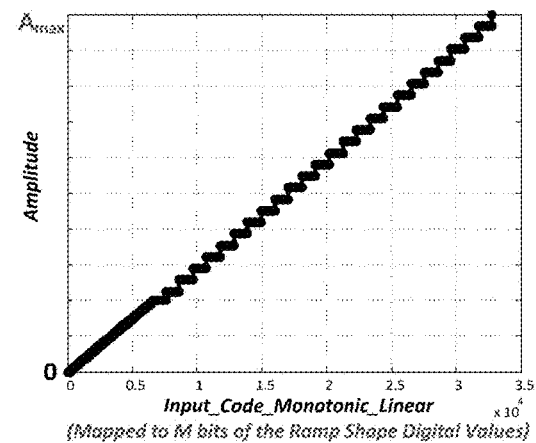
FIG. 9B is a graphic showing those monotonic and linear input codes mapped against amplitude according in to an embodiment of the present disclosure.
Figure 10A:
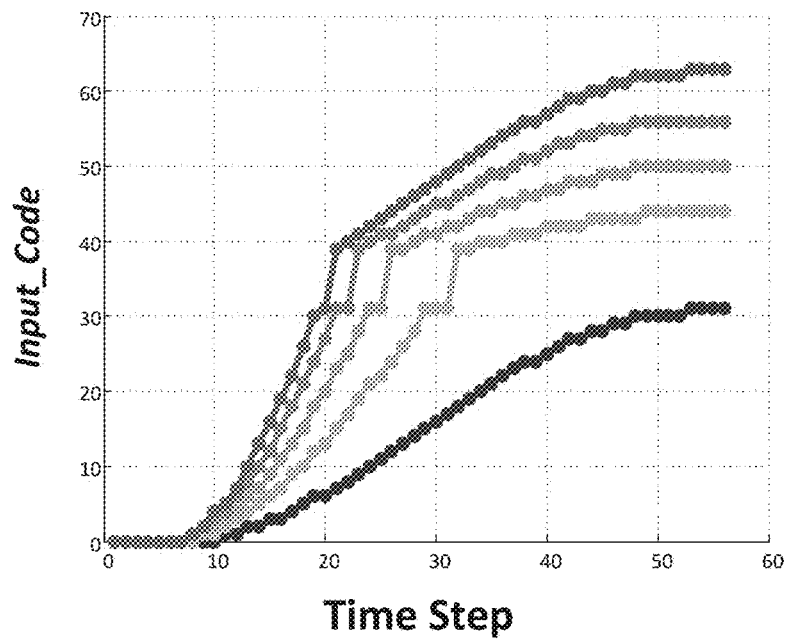
Figure 10B:
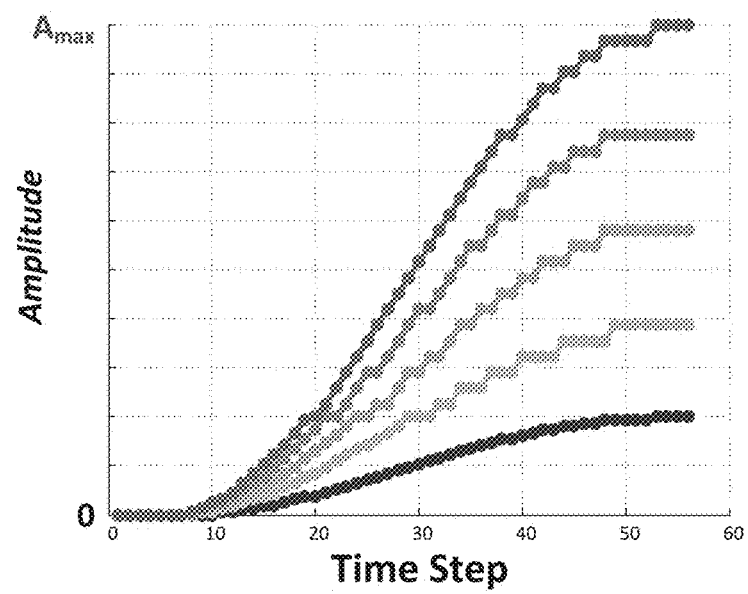
FIG. 10B is a graphic of time step vs. amplitude of the modified input code according in to an embodiment of the present disclosure.

Finally, the ramp shaper 440 receives the amplitude-adjusted and frequency-adjusted ramp shape and appropriately shapes it to avoid the non-linearity and non-monotonicity that may be inherent in DPA 410. More specifically, the ramp shape is adjusted according to a relationship model retrieved from a relationship model storage 450. The generation of the stored relationship model is described below with reference to FIGS. 7, 8A-8B, 9A-9B, and 10A-10B. As shown in FIG. 4, an example of the output of the ramp shaper 440 is illustrated by FIGS. 10A and 10B, which are described further below.

As would be understood by one of ordinary skill in the art, FIG. 4 is a simplified diagram, the paragraphs above are an overview focusing on the details pertinent to the present disclosure, and a real-world implementation would be much more complex, require more stages and/or components, and would also vary depending on the requirements of the particular implementation.

FIG. 6 is a flowchart of the real-time operation of a ramp generation block for DPA control according to an embodiment of the present disclosure.

The present system receives a synchronization signal that indicates the start of a ramp-up or a ramp-down process. At 610, the present system retrieves the ramp shape from storage and clocks the ramp shape to the desired frequency. At 620, the present system scales the ramp shape according the required maximum slot amplitude $A_{slot}$ for that transmission slot, which may be received from, e.g., the controller of the broadband modem chip. At 630, the present system retrieves the relationship model from storage and uses it to shape the ramp shape to avoid any possible non-linearities and/or non-monotonicities caused by the specific DPA generating the slot signal. More specifically, the present system uses the stored monotonic/linear amplitude versus digital input code relationship generated for that DPA to create the final n-bit control input for the DPA.

Figure 7:
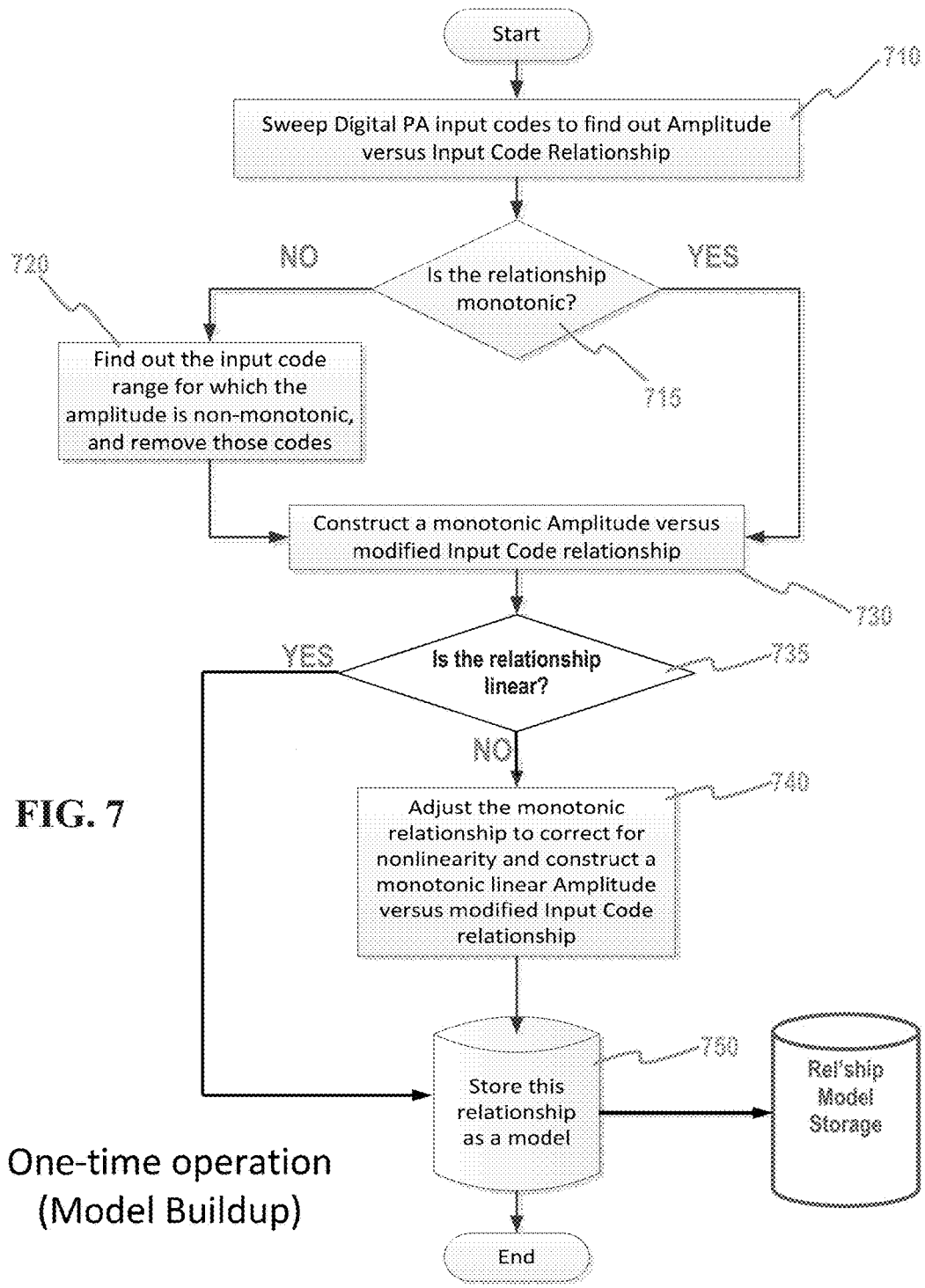
FIG. 7 is a flowchart of the one-time operation for generating a relationship model to be used by a ramp generation block according to an embodiment of the present disclosure.

FIG. 7 is a flowchart of the one-time operation for generating a relationship model to be used by a ramp generation block according to an embodiment of the present disclosure. FIGS. 8A-8D are amplitude/code graphs illustrating examples of how the input control code is manipulated through the one-time operation according to an embodiment of the present disclosure.

Figure 8A:
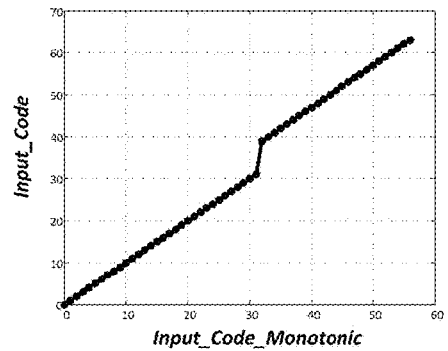

At 710, the present system sweeps the input codes of the DPA in order to determine the amplitude versus input control code relationship. In other words, each possible control input code is entered and the resulting output amplitudes are analyzed. At 715, the present system determines whether the amplitude-to-control input code relationship is monotonic. If it is determined that the amplitude-to-control input code relationship is not monotonic (NO at 715), the present system removes the input control codes which produce the non-monotonic portions at 720. Using FIG. 3B as an example of a non-monotonic amplitude-to-control input code relationship, FIG. 8A shows the input codes (Input_Code) from FIG. 2C mapped to a new set of input codes (Input_Code_Monotonic) where the non-monotonic codes are skipped.

Figure 8B:
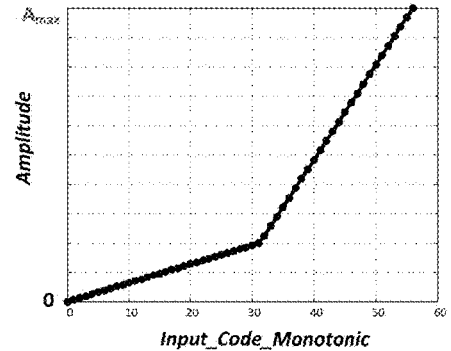
FIG. 8B is a graphic showing those monotonic input codes mapped against amplitude according in to an embodiment of the present disclosure.

After 720, or if all of the amplitude-to-control input code relationships are monotonic (YES at 715), the process goes to 730. At 730, the present system constructs monotonic amplitude-to-control input code relationships—i.e., if non-monoticity is found, modified input control codes replace the removed input codes so as to ensure monotonic amplitude-to-control input code relationships. Such a relationship is shown in FIG. 8B.

At 735, the present system determines whether the constructed monotonic amplitude-to-control input code relationships are linear, which can still be the case when there is monotonicity. For example, when the new set of input codes Input_Code_Monotonic are mapped against amplitude in FIG. 8B, it is clear the resulting ramp is non-linear. Accordingly, the present system determines whether monotonic relationship is linear at 735. If the monotonic relationship(s) is linear (735=YES), the constructed monotonic and linear amplitude-to-control input code relationships are stored as a model at 750. If the monotonic relationship(s) is not linear (735=NO), the process continues at 740.

At 740, the monotonic amplitude-to-input control code relationships generated at 730 are adjusted for non-linearity, resulting in the construction of amplitude-to-input control code relationships which are both monotonic and linear. This is done by inverting the nonlinear Amplitude versus Input_Code_Monotonic relationship as shown in the example of FIG. 8B. FIG. 9A shows a new set of input codes Input_Code_Monotonic_Linear (mapped to the M-bit digital values of the stored ramp shape) constructed from adjusting the input code Input_Code_Monotonic from FIGS. 8A-8B. Then, by mapping the Input_Code to the Amplitude relationship of the DPA shown in FIG. 2C, the Input_Code_Monotonic_Linear to Amplitude relationship is both linear and monotonic as shown in FIG. 9B.

At 750, the monotonic and linear amplitude-to-input control code relationship model for the DPA is stored for use in real-time operation. For example, the model could be stored in Relationship Model Storage 450 in FIG. 4.

In the description of FIG. 4, we noted that FIGS. 10A and 10B illustrate an example of the output of Ramp Shaper 440, generated from the monotonic and linear amplitude-to-input control code relationship model retrieved from Relationship Model Storage 450. In fact, FIGS. 10A and 10B show the five examples of scaled ramp shapes illustrated in FIG. 5C after the application of the amplitude-to-input control code relationship model illustrated by FIGS. 9A and 9B. More specifically, FIG. 10A is a graphic of the input code vs. time step, where the five scaled ramp shapes in FIG. 5C have been mapped to the input code by applying the Input_Code vs. Input_Code_Monotonic_Linear relationship illustrated by FIG. 9A. Similarly, FIG. 10B is a graphic of the DPA amplitude versus time step.

Depending on the embodiment of the present disclosure, steps and/or operations in accordance with the present disclosure may occur in a different order, or in parallel, or concurrently for different epochs, etc., in different embodiments, as would be understood by one of ordinary skill in the art. Similarly, as would be understood by one of ordinary skill in the art, FIGS. 3, 6, and 7 are simplified representations of the actions performed, and real-world implementations may perform the actions in a different order or by different ways or means. Similarly, as simplified representations, FIGS. 3, 6, and 7 do not show other required actions and/or operations as these are known and understood by one of ordinary skill in the art and not pertinent and/or helpful to the present description.

Depending on the embodiment of the present disclosure, some or all of the actions, steps, and/or operations may be implemented or otherwise performed, at least in part, on a mobile or portable device. A "mobile device" or "portable device" as used herein refers to any movable electronic device having the capability of receiving wireless signals, including, but not limited to, multimedia players, communication devices, computing devices, navigating devices, etc. Thus, mobile/portable devices include, but are not limited to, laptops, tablet computers, Portable Digital Assistants (PDAs), mp3 players, handheld PCs, Instant Messaging Devices (IMD), cellular telephones, Global Navigational Satellite System (GNSS) receivers, watches, cameras or any such device which can be worn and/or carried on one's person. The portable/mobile device may also be "User Equipment" or "UE" as that term is used in the $3^{rd}$ Generation Partnership Project (3GPP) Long Term Evolution (LTE)/LTE-Advanced (LTE-A) protocols, but is not in any way limited by the 3GPP protocols.

Depending on the embodiment of the present disclosure, some or all of the steps and/or operations may be implemented or otherwise performed, at least in part, using one or more processors running instruction(s), program(s), interactive data structure(s), client and/or server components, where such instruction(s), program(s), interactive data structure(s), client and/or server components are stored in one or more non-transitory computer-readable media. The one or more non-transitory computer-readable media may be instantiated in software, firmware, hardware, and/or any combination thereof. Moreover, the functionality of any "block" or "module" discussed herein may be implemented in software, firmware, hardware, and/or any combination thereof.

As an example, various embodiments of the present disclosure could be implemented as a part of a (possibly multi-standard) broadband and/or baseband modem chip, as would be understood by one of ordinary skill in the art, in view of the present disclosure.

The one or more non-transitory computer-readable media and/or means for implementing/performing one or more operations/steps/modules of embodiments of the present disclosure may include, without limitation, application-specific integrated circuits ("ASICs"), standard integrated circuits, controllers executing appropriate instructions (including microcontrollers and/or embedded controllers), field-programmable gate arrays ("FPGAs"), complex programmable logic devices ("CPLDs"), and the like. Some or all of any system components and/or data structures may also be stored as contents (e.g., as executable or other non-transitory machine-readable software instructions or structured data) on a non-transitory computer-readable medium (e.g., as a hard disk, a memory, a computer network or cellular wireless network or other data transmission medium, or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques. Some or all of any system components and data structures may also be stored as data signals on a variety of non-transitory computer-readable transmission mediums, from which they are read and then transmitted, including across wireless-based and wired/cable-based mediums, and may take a variety of forms (e.g., as part of a single or multiplexed analog signal, or as multiple discrete digital packets or frames). Such computer program products may also take other forms in other embodiments. Accordingly, embodiments of this disclosure may be practiced in any computer system configuration.

Thus, the term "non-transitory computer-readable medium" as used herein refers to any medium that includes the actual performance of an operation (such as hardware circuits), that includes programs and/or higher-level instructions to be provided to one or more processors for performance/implementation (such as instructions stored in a non-transitory memory), and/or that includes machine-level instructions stored in, e.g., firmware or non-volatile memory. Non-transitory computer-readable media may take many forms, such as non-volatile and volatile media, including but not limited to, a floppy disk, flexible disk, hard disk, RAM, PROM, EPROM, FLASH-EPROM, EEPROM, any memory chip or cartridge, any magnetic tape, or any other magnetic medium from which a computer instruction can be read; a CD-ROM, DVD, or any other optical medium from which a computer instruction can be read, or any other non-transitory medium from which a computer instruction can be read.

While certain embodiments of the disclosure have been shown and described herein it will be understood by those skilled in the art that various changes in form and detail may be made without departing from the scope of the disclosure as defined by the appended claims.

What is claimed is:

1. A method, comprising:
   detecting one or more control input codes to a digital power amplifier (DPA) that generate a non-monotonic amplitude output;
   generating a monotonic amplitude-to-control input code relationship model for the DPA based on the one or more control input codes;
   adjusting the monotonic amplitude-to-control input code relationship model to construct a monotonic and linear amplitude-to-control input code relationship model; and
   storing the monotonic and linear amplitude-to-control input code relationship model,
   wherein, during ramp generation by the DPA, the stored monotonic and linear amplitude-to-control input code relationship model is applied to a control code for one of a ramp-up and a ramp-down before the control input code is input to the DPA.

2. The method of claim 1, wherein detecting one or more control input codes to the DPA that generate non-monotonic amplitude output comprises:
   sweeping through all of the control input codes to generate an amplitude-to-control input code relationship profile; and
   determining whether the amplitude-to-control input code relationship profile is monotonic.

3. The method of claim 2, wherein generating a monotonic amplitude-to-control input code relationship model for the DPA based on the one or more control input codes comprises:
   isolating a control input range in which amplitude is non-monotonic based on determining that the amplitude-to-control input code relationship profile is non-monotonic.

4. The method of claim 3, wherein isolating the control input range for which the amplitude is non-monotonic comprises:
   removing the control input range for which the amplitude is non-monotonic.

5. The method of claim 3, wherein generating a monotonic amplitude-to-control input code relationship model for the DPA based on the detecting step further comprises:
   modifying the control input range for which the amplitude is non-monotonic to generate the monotonic amplitude-to-control input code relationship model.

6. The method of claim 1, wherein the steps of detecting, generating, adjusting, and storing are performed when a broadband chip comprising the DPA is initiated.

7. The method of claim 1, wherein the steps of detecting, generating, adjusting, and storing are performed when a model re-calculation condition is detected.

8. The method of claim 7, wherein a model re-calculation condition comprises an operating parameter change.

9. The method of claim 1, wherein a broadband chip comprising the DPA is a multi-standard broadband chip capable of 2G transmission for a polar transmitter.

10. A method, comprising:
    if a time division multiple access (TDMA) slot is to be generated by a digital power amplifier (DPA), retrieving control input code for a ramp-up shape from a ramp shape storage, where the control input code is for controlling an amplitude of the DPA;
    adjusting the retrieved control input code for frequency and amplitude;
    shaping the frequency-adjusted and amplitude-adjusted control input code based on a monotonic and linear amplitude-to-control input code relationship model; and
    inputting the shaped control input code to the DPA to generate the ramp-up shape,
    wherein the monotonic and linear amplitude-to-control input code relationship model is based on an amplitude-to-control input code relationship of the DPA.

11. The method of claim 10, further comprising:
    generating a data portion of the TDMA slot after the ramp-up portion is generated.

12. The method of claim 11, further comprising:
    retrieving control input code for a ramp-down shape from the ramp shape storage;
    adjusting the retrieved control input code for frequency and amplitude;
    shaping the frequency-adjusted and amplitude-adjusted control input code based on a second monotonic and linear amplitude-to-control input code relationship model; and
    inputting the shaped control input code to the DPA to generate the ramp-down shape after the data portion of the TDMA is generated,
    wherein the second monotonic and linear amplitude-to-control input code relationship model was generated based on the amplitude-to-control input code relationship of the DPA.

13. The method of claim 10, wherein the monotonic and linear amplitude-to-control input code relationship model was previously generated and stored in a relationship model storage.

14. The method of claim 13, wherein the monotonic and linear amplitude-to-control input code relationship model was generated and stored by:
    detecting any control input codes to the DPA which generate non-monotonic amplitude output;
    generating a monotonic amplitude-to-control input code relationship model for the DPA based on the detecting step;

adjusting the monotonic amplitude-to-control input code relationship model to construct a monotonic and linear amplitude-to-control input code relationship model; and storing the monotonic and linear amplitude-to-control input code relationship model.

15. The method of claim 14, wherein the steps of detecting, generating, adjusting, and storing are performed when a model re-calculation condition is detected.

16. A broadband modem chip, comprising:
a digital power amplifier (DPA);
at least one non-transitory computer-readable medium; and
a processor,
wherein, if a time division multiple access (TDMA) slot is to be generated, the processor executes instructions stored on the at least one non-transitory computer-readable medium, which, when executed, has the broadband modem chip perform at least the following steps:
retrieving control input code for a ramp-up shape from a ramp shape storage, where the control input code is for controlling an amplitude of the DPA;
adjusting the retrieved control input code for frequency and amplitude;
shaping the frequency-adjusted and amplitude-adjusted control input code based on a monotonic and linear amplitude-to-control input code relationship model; and
inputting the shaped control input code to the DPA to generate the ramp-up shape,
wherein the monotonic and linear amplitude-to-control input code relationship model is based on an amplitude-to-control input code relationship of the DPA, and was previously generated and stored.

17. The broadband modem chip of claim 16, wherein, when the broadband modem chip was initiated, the monotonic and linear amplitude-to-control input code relationship model was generated and stored by:
detecting any control input codes to the DPA which generate non-monotonic amplitude output;
generating a monotonic amplitude-to-control input code relationship model for the DPA based on the detecting step;
adjusting the monotonic amplitude-to-control input code relationship model to construct a monotonic and linear amplitude-to-control input code relationship model; and
storing the monotonic and linear amplitude-to-control input code relationship model.

18. The broadband modem chip of claim 16, wherein, when a model re-calculation condition is detected, a new monotonic and linear amplitude-to-control input code relationship model is generated and stored by:
detecting any control input codes to the DPA which generate non-monotonic amplitude output;
generating a monotonic amplitude-to-control input code relationship model for the DPA based on the detecting step;
adjusting the monotonic amplitude-to-control input code relationship model to construct a monotonic and linear amplitude-to-control input code relationship model; and
storing the monotonic and linear amplitude-to-control input code relationship model.

19. The broadband modem chip of claim 18, wherein a model re-calculation condition comprises an operating parameter change.

20. The broadband modem chip of claim 16, wherein the broadband modem chip is a multi-standard broadband chip capable of 2G transmission for a polar transmitter.

* * * * *